(12) United States Patent
Noma et al.

(10) Patent No.: US 7,919,875 B2
(45) Date of Patent: Apr. 5, 2011

(54) SEMICONDUCTOR DEVICE WITH RECESS PORTION OVER PAD ELECTRODE

(75) Inventors: Takashi Noma, Ota (JP); Katsuhiko Kitagawa, Ota (JP); Hisao Otsuka, Gunma (JP); Akira Suzuki, Ota (JP); Yoshinori Seki, Gunma (JP); Yukihiro Takao, Gunma (JP); Keiichi Yamaguchi, Gifu (JP); Motoaki Wakui, Kumagaya (JP); Masanori Iida, Gunma (JP)

(73) Assignees: Sanyo Electric Co., Ltd., Moriguchi-shi (JP); Kanto Sanyo Semiconductor Co., Ltd., Gunma (JP)

( * ) Notice: Subject to any disclaimer, the term of this patent is extended or adjusted under 35 U.S.C. 154(b) by 4 days.

(21) Appl. No.: 11/956,160

(22) Filed: Dec. 13, 2007

(65) Prior Publication Data

US 2008/0093708 A1    Apr. 24, 2008

Related U.S. Application Data

(62) Division of application No. 10/910,805, filed on Aug. 4, 2004, now Pat. No. 7,312,107.

(30) Foreign Application Priority Data

Aug. 6, 2003   (JP) ................. 2003-288150
Jan. 30, 2004  (JP) ................. 2004-022989

(51) Int. Cl.
  *H01L 23/48*   (2006.01)
  *H01L 23/52*   (2006.01)
  *H01L 29/40*   (2006.01)

(52) U.S. Cl. . 257/783; 257/620; 257/773; 257/E23.012; 257/E23.02

(58) Field of Classification Search ............... 438/406, 438/620, 110, 113–114, 458–465, 401; 257/780–784, E21.122, E23.021, E23.011, 257/E23.133, E21.502, 797, E23.01, E23.179, 257/E21.599, 620–622, E23.012, E23.02, 257/E23.024, E21.578, E21.597–E21.602, 257/698, 701, 737, 750, 773, E23.015
See application file for complete search history.

(56) References Cited

U.S. PATENT DOCUMENTS 3,648,131 A    3/1972    Stuby
(Continued)

FOREIGN PATENT DOCUMENTS

DE    19846232    3/2000
(Continued)

OTHER PUBLICATIONS

A. Badihi. "ShellCase Ultrathin Chip Size Package", Mar. 14, 1999, Proceedings International Symposium on Advanced Packaging Materials Processes, Properties and Interfaces; pp. 236-240.
(Continued)

*Primary Examiner* — Matthew C Landau
*Assistant Examiner* — Joseph C Nicely
(74) *Attorney, Agent, or Firm* — Morrison & Foerster LLP

(57) ABSTRACT

A manufacturing method of a semiconductor device formed in a chip size package is improved to enhance a yield and reliability. A window to expose first wirings is formed only in a region of a semiconductor substrate where the first wirings exist. As a result, area of the semiconductor substrate bonded to a supporting body through an insulation film and a resin is increased to prevent cracks in the supporting body and separation of the semiconductor substrate from the supporting body. A slit is formed along a dicing line after forming the window, the slit is covered with a protection film and then the semiconductor substrate is diced into individual semiconductor dice. Thus, separation on a cut surface or at an edge of the semiconductor dice, which otherwise would be caused by contact of the blade in the dicing can be prevented.

4 Claims, 13 Drawing Sheets

U.S. PATENT DOCUMENTS

| | | |
|---|---|---|
| 3,756,872 A | 9/1973 | Goodman |
| 3,787,252 A | 1/1974 | Filippazzi et al. |
| 4,179,794 A | 12/1979 | Kosugi et al. |
| 4,954,875 A | 9/1990 | Clements |
| 4,978,639 A | 12/1990 | Hua et al. |
| 5,229,647 A | 7/1993 | Gnadinger |
| 5,350,662 A | 9/1994 | Chi |
| 5,476,819 A | 12/1995 | Warren |
| 5,648,684 A | 7/1997 | Bertin et al. |
| 5,682,062 A | 10/1997 | Gaul |
| 5,691,245 A | 11/1997 | Bakhit et al. |
| 5,895,234 A | 4/1999 | Taniguchi et al. |
| 5,895,970 A | 4/1999 | Miyoshi |
| 5,904,546 A | 5/1999 | Wood et al. |
| 5,910,687 A | 6/1999 | Chen et al. |
| 5,927,993 A | 7/1999 | Lesk et al. |
| 5,998,866 A | 12/1999 | Ochi et al. |
| 6,002,163 A | 12/1999 | Wojnarowski |
| 6,027,958 A | 2/2000 | Vu et al. |
| 6,040,235 A * | 3/2000 | Badehi ............ 438/464 |
| 6,042,922 A | 3/2000 | Senoo et al. |
| 6,051,489 A | 4/2000 | Young et al. |
| 6,054,760 A | 4/2000 | Martinez-Tovar et al. |
| 6,066,513 A * | 5/2000 | Pogge et al. ............ 438/113 |
| 6,110,825 A | 8/2000 | Mastromatteo et al. |
| 6,136,668 A | 10/2000 | Tamaki et al. |
| 6,184,060 B1 | 2/2001 | Siniaguine |
| 6,214,639 B1 | 4/2001 | Emori et al. |
| 6,221,751 B1 | 4/2001 | Chen et al. |
| 6,259,039 B1 | 7/2001 | Chroneos et al. |
| 6,300,224 B1 * | 10/2001 | Arima et al. ............ 438/462 |
| 6,316,287 B1 | 11/2001 | Zandman et al. |
| 6,326,689 B1 | 12/2001 | Thomas |
| 6,339,251 B2 * | 1/2002 | Ha et al. ............ 257/620 |
| 6,358,772 B2 | 3/2002 | Miyoshi |
| 6,362,529 B1 | 3/2002 | Sumikawa et al. |
| 6,399,463 B1 * | 6/2002 | Glenn et al. ............ 438/463 |
| 6,406,934 B1 | 6/2002 | Glenn et al. |
| 6,420,211 B1 | 7/2002 | Brunet et al. |
| 6,424,031 B1 | 7/2002 | Glenn |
| 6,432,744 B1 | 8/2002 | Amador et al. |
| 6,433,418 B1 | 8/2002 | Fujisawa et al. |
| 6,485,814 B1 | 11/2002 | Moriizumi et al. |
| 6,506,681 B2 | 1/2003 | Grigg et al. |
| 6,552,426 B2 | 4/2003 | Ishio et al. |
| 6,573,157 B1 * | 6/2003 | Sato ............ 438/462 |
| 6,597,059 B1 | 7/2003 | McCann et al. |
| 6,607,941 B2 * | 8/2003 | Prabhu et al. ............ 438/113 |
| 6,611,052 B2 | 8/2003 | Poo et al. |
| 6,624,505 B2 | 9/2003 | Badehi |
| 6,646,289 B1 | 11/2003 | Badehi |
| 6,649,931 B2 | 11/2003 | Honma et al. |
| 6,693,358 B2 | 2/2004 | Yamada et al. |
| 6,703,689 B2 | 3/2004 | Wada |
| 6,720,661 B2 | 4/2004 | Hanaoka et al. |
| 6,753,936 B2 | 6/2004 | Tanaka |
| 6,780,251 B2 | 8/2004 | Tometsuka |
| 6,781,244 B2 * | 8/2004 | Prabhu ............ 257/778 |
| 6,805,279 B2 | 10/2004 | Lee et al. |
| 6,812,573 B2 | 11/2004 | Shimoishizaka et al. |
| 6,828,175 B2 | 12/2004 | Wood et al. |
| 6,848,177 B2 | 2/2005 | Swan et al. |
| 6,864,172 B2 * | 3/2005 | Noma et al. ............ 438/674 |
| 6,894,386 B2 | 5/2005 | Poo et al. |
| 6,964,915 B2 | 11/2005 | Farnworth et al. |
| 7,045,870 B2 | 5/2006 | Wataya |
| 7,064,047 B2 * | 6/2006 | Fukasawa et al. ............ 438/460 |
| 7,067,354 B2 * | 6/2006 | Prabhu ............ 438/113 |
| 7,101,735 B2 * | 9/2006 | Noma et al. ............ 438/114 |
| 7,112,881 B2 * | 9/2006 | Kaida et al. ............ 257/698 |
| 7,157,742 B2 * | 1/2007 | Badehi ............ 257/81 |
| 7,205,635 B1 * | 4/2007 | MacIntyre ............ 257/620 |
| 7,208,340 B2 * | 4/2007 | Noma ............ 438/106 |
| 7,271,466 B2 | 9/2007 | Noma et al. |
| 7,312,107 B2 | 12/2007 | Noma et al. |
| 7,312,521 B2 | 12/2007 | Noma et al. |
| 7,399,683 B2 | 7/2008 | Noma et al. |
| 7,456,083 B2 * | 11/2008 | Noma et al. ............ 438/460 |
| 2001/0005043 A1 | 6/2001 | Nakanishi et al. |
| 2002/0005400 A1 | 1/2002 | Gat |
| 2002/0016024 A1 * | 2/2002 | Thomas ............ 438/113 |
| 2002/0022343 A1 | 2/2002 | Nonaka |
| 2002/0025587 A1 | 2/2002 | Wada |
| 2002/0038890 A1 | 4/2002 | Ohuchi |
| 2002/0047210 A1 | 4/2002 | Yamada et al. |
| 2002/0048889 A1 | 4/2002 | Hayama et al. |
| 2002/0076855 A1 | 6/2002 | Pierce |
| 2002/0089043 A1 | 7/2002 | Park et al. |
| 2002/0105591 A1 | 8/2002 | Nakamura et al. |
| 2002/0110953 A1 | 8/2002 | Ahn et al. |
| 2002/0139577 A1 | 10/2002 | Miller |
| 2002/0158060 A1 | 10/2002 | Uchiyama et al. |
| 2002/0185725 A1 | 12/2002 | Moden et al. |
| 2003/0077878 A1 | 4/2003 | Kumar et al. |
| 2003/0094683 A1 | 5/2003 | Poo et al. |
| 2003/0134453 A1 | 7/2003 | Prabhu et al. |
| 2003/0216009 A1 * | 11/2003 | Matsuura et al. ............ 438/460 |
| 2003/0230805 A1 * | 12/2003 | Noma et al. ............ 257/737 |
| 2004/0017012 A1 | 1/2004 | Yamada et al. |
| 2004/0041260 A1 | 3/2004 | Wood |
| 2004/0063268 A1 | 4/2004 | Noma et al. |
| 2004/0137701 A1 * | 7/2004 | Takao ............ 438/461 |
| 2004/0137723 A1 | 7/2004 | Noma et al. |
| 2004/0142509 A1 | 7/2004 | Imai |
| 2004/0161920 A1 * | 8/2004 | Noma ............ 438/620 |
| 2004/0229405 A1 | 11/2004 | Prabhu |
| 2004/0235270 A1 | 11/2004 | Noma et al. |
| 2004/0238926 A1 * | 12/2004 | Obinata ............ 257/678 |
| 2005/0009313 A1 * | 1/2005 | Suzuki et al. ............ 438/611 |
| 2005/0095750 A1 * | 5/2005 | Lo et al. ............ 438/114 |
| 2005/0176235 A1 | 8/2005 | Noma et al. |
| 2005/0208735 A1 * | 9/2005 | Noma et al. ............ 438/460 |
| 2005/0221585 A1 * | 10/2005 | Perregaux et al. ............ 438/460 |
| 2005/0266660 A1 | 12/2005 | Behammer |
| 2006/0033198 A1 | 2/2006 | Noma et al. |
| 2006/0068572 A1 * | 3/2006 | Noma et al. ............ 438/577 |
| 2006/0079019 A1 | 4/2006 | Kim et al. |
| 2006/0141750 A1 * | 6/2006 | Suzuki et al. ............ 438/460 |
| 2006/0270093 A1 | 11/2006 | Noma et al. |
| 2007/0026639 A1 * | 2/2007 | Noma et al. ............ 438/459 |
| 2007/0117352 A1 * | 5/2007 | Lee et al. ............ 438/460 |
| 2007/0138498 A1 | 6/2007 | Zilber et al. |
| 2007/0166957 A1 | 7/2007 | Kameyama et al. |
| 2008/0265424 A1 * | 10/2008 | Noma et al. ............ 257/762 |
| 2009/0023249 A1 * | 1/2009 | Honer et al. ............ 438/113 |

FOREIGN PATENT DOCUMENTS

| | | |
|---|---|---|
| DE | 10238444 | 3/2004 |
| EP | 0468874 A2 | 1/1992 |
| EP | 0468874 A3 | 1/1992 |
| EP | 1041617 | 10/2000 |
| EP | 1085570 | 3/2001 |
| EP | 1376678 | 1/2004 |
| EP | 1429377 | 6/2004 |
| FR | 2767223 | 2/1999 |
| JP | 62-094925 | 5/1987 |
| JP | 62-101678 | 5/1987 |
| JP | 3-152942 | 6/1991 |
| JP | 3-286553 | 12/1991 |
| JP | 5-287082 | 11/1993 |
| JP | 7-58132 | 3/1995 |
| JP | 09-46566 | 2/1997 |
| JP | 09-063993 | 3/1997 |
| JP | 10-242084 | 9/1998 |
| JP | 11-163193 | 6/1999 |
| JP | 11-307624 | 11/1999 |
| JP | 2000-77478 | 3/2000 |
| JP | 2000-173952 | 6/2000 |
| JP | 2000-183025 | 6/2000 |
| JP | 2000-195987 | 7/2000 |
| JP | 2000-286283 | 10/2000 |
| JP | 2001-068618 | 3/2001 |
| JP | 2001-77229 | 3/2001 |
| JP | 2001-127243 | 5/2001 |
| JP | 2001-185519 | 7/2001 |
| JP | 2001-189414 | 7/2001 |
| JP | 2001-210667 | 8/2001 |

| | | |
|---|---|---|
| JP | 2002-083785 | 3/2002 |
| JP | 2002-093942 | 3/2002 |
| JP | 2002-094082 | 3/2002 |
| JP | 2002-512436 A1 | 4/2002 |
| JP | 2002-231918 | 8/2002 |
| JP | 2002-270676 | 9/2002 |
| JP | 2002-329849 | 11/2002 |
| JP | 2003-7898 | 1/2003 |
| JP | 2003-116066 | 4/2003 |
| JP | 2005-191550 | 7/2005 |
| KR | 10-0410812 | 12/2003 |
| WO | WO-99/36958 | 7/1999 |
| WO | WO-99/40624 A1 | 8/1999 |
| WO | WO-02/50875 | 6/2002 |
| WO | WO-02/51217 | 6/2002 |

OTHER PUBLICATIONS

Noma, Takashi et al., U.S Office Action mailed Jul. 11, 2008, directed at U.S. Appl. No. 90/008,219; 17 pages.

Noma, Takashi et al., U.S Office Action mailed Apr. 28, 2009, directed at U.S. Appl. No. 11/488,890;8 pages.

Noma, Takashi et al., U.S Office Action mailed Mar. 28, 2005, directed at U.S. Appl. No. 10/696,581; 10 pages.

Noma, Takashi et al., U.S Office Action mailed Jul. 27, 2005, directed at U.S. Appl. No. 10/876,532; 6 pages.

Noma, Takashi et al., U.S Office Action mailed Mar. 15, 2006, directed at U.S. Appl. No. 10/876,532; 9 pages.

Noma, Takashi et al., U. S Office Action mailed Apr. 16, 2008, directed at U.S. Appl. No. 10/876,532; 7 pages.

Noma, Takashi et al., U.S Office Action mailed Sep. 5, 2006, directed at U.S. Appl. No. 10/876,532; 7 pages.

Noma, Takashi et al., U.S Office Action mailed Mar. 5, 2007, directed at U.S. Appl. No. 10/876,532;7 pages.

Noma, Takashi et al., U.S Office Action mailed May 26, 2009, directed at U.S. Appl. No. 10/876,532; 11 pages.

Noma, Takashi et al., U.S Office Action mailed Nov. 20, 2006, directed at U.S. Appl. No. 11/206,146;9 pages.

Noma, Takashi et al., U.S Office Action mailed on May 1, 2007, directed at U.S. Appl. No. 11/206,146;5 pages.

Noma, Takashi et al., U.S Office Action mailed Apr. 28, 2009, directed at U.S. Appl. No. 11/645,811; 9 pages.

Noma, Takashi et al., U.S Office Action mailed Dec. 9, 2004, directed at U.S. Appl. No. 10/420,943; 8 pages.

Noma, Takashi et al., U.S Office Action mailed Aug. 1, 2006, directed at U.S. Appl. No. 10/420,943; 8 pages.

Noma, Takashi et al., U.S Office Action mailed Feb. 2, 2007, directed at U.S. Appl. No. 10/420,943; 9 pages.

Noma, Takashi et al., U.S Office Action mailed Aug. 27, 2007, directed at U.S. Appl. No. 11/035,399; 7 pages.

Noma, Takashi et al., U.S Office Action mailed Mar. 7, 2007, directed at U.S. Appl. No. 11/035,399; 6 pages.

Noma, Takashi et al., U.S Office Action mailed Feb. 26, 2009, directed at U.S. Appl. No. 12/133,171; 7 pages.

Noma, Takashi et al., U.S Office Action mailed Apr. 12, 2007, directed at U.S. Appl. No. 10/910,805; 7 pages.

Noma, Takashi et al., U.S Office Action mailed Oct. 11, 2006, directed at U.S. Appl. No. 10/910,805; 8 pages.

Noma, Takashi et al., U.S Office Action mailed Apr. 2, 2004, directed at U.S. Appl. No. 10/462,829; 8 pages.

Noma, Takashi et al., U.S Office Action mailed Jul. 21, 2006, directed at U.S. Appl. No. 10/733,799; 7 pages.

Noma, Takashi et al., U.S Office Action mailed Nov. 8, 2005, directed at U.S. Appl. No. 10/733,799; 5 pages.

Noma, Takashi et al., U.S Office Action mailed Jun. 9, 2005, directed at U.S. Appl. No. 10/733,799; 7 pages.

European Search Report, dated Apr. 3, 2009 directed at counterpart application No. EP 04 01 8715; 3 pages.

European Search Report, dated Sep. 12, 2003, directed to EP-03010938; (4 pages).

European Office Action, dated Sep. 20, 2004, directed to EP Application No. 03013839.0; (5 pages).

European Office Action, dated Aug. 10, 2005, directed to EP Application No. 030109388.3; (15 pages).

European Office Action, dated Sep. 26, 2005, directed to EP Application No. 03013839.0; (3 pages).

European Office Action, dated Apr. 10, 2006, directed to EP Application No. 0301938.3; (4 pages).

European Search Report, dated Jul. 21, 2009, directed to EP Application No. 06026978.4; (4 pages).

Noma et al., U.S. Office Action mailed Nov. 14, 2008, directed to U.S. Appl. No. 10/876,532; (9 pages).

Kameyama, K. et al., U.S. Office Action mailed on Oct. 14, 2009, directed to U.S. Appl. No. 11/645,811; 8 pages.

Noma, T. et al., U.S. Office Action mailed on Oct. 27, 2009, directed to U.S. Appl. No. 12/133,171; 6 pages.

Extended EP Search Report dated Sep. 24, 2009, directed to European Patent Application No. 06026978.4; 15 pages.

EP Office Action dated Mar. 20, 2007, directed to EP Patent Application No. 03025016.1; 3 pages.

EP Office Action dated Nov. 25, 2005, directed to EP Patent Application No. 03025016.1; 4 pages.

EP Office Action dated Dec. 2, 2004, directed to EP Patent Application No. 03025016.1; 6 pages.

European Search Report dated Jan. 28, 2004, directed to European Patent Application No. 03025016.1; 2 pages.

EP Office Action dated Oct. 31, 2005, directed to EP Patent Application No. 03028639.7; 9 pages.

European Search Report dated Jan. 18, 2005, directed to European Patent Application No. 03028639.7; 5 pages.

Partial European Search Report mailed Nov. 5, 2004, directed to European Patent Application No. 03028639.7; 5 pages.

Kameyama et al., Office Action mailed Jan. 29, 2010, directed at U.S. Appl. No. 11/645,811; 9 pages.

European Office Action issued Jun. 10, 2010 directed to Application No. 04 018 715.5; 4 pages.

Noma et al., U.S. Office Action mailed Jul. 20, 2010 directed to U.S. Appl. No. 10/876,532; 7 pages.

Noma, T. et al., U.S. Office Action mailed Nov. 22, 2010, directed to U.S. Appl. No. 10/876,532; 7 pages.

* cited by examiner

SEMICONDUCTOR DEVICE WITH RECESS PORTION OVER PAD ELECTRODE

CROSS-REFERENCE OF THE INVENTION

This application is a divisional of Ser. No. 10/910,805, filed Aug. 4, 2004, now U.S. Pat. No. 7,312,107.

The semiconductor device described above has disadvantages of increased thickness and higher manufacturing cost, since it uses two glass substrates. So, a method to bond the glass substrate only to the top surface of the semiconductor die, on which the first wiring is formed, has been considered. In this case, the bottom surface of the device is made of the semiconductor substrate which is easier to process by etching compared with the glass substrate. Taking this advantage, the first wiring is exposed by etching the semiconductor substrate and the insulation film in the dicing line region in order for the first wiring to be connected with the second wiring. As a result, a contact area between the first wiring and the second wiring is increased, compared with the conventional method using two glass substrates. After forming the second wirings, a protection film 110 and the conductive terminals, the semiconductor substrate is finally separated into individual semiconductor dice by cutting the glass substrate.

BACKGROUND OF THE INVENTION

1. Field of the Invention

This invention relates to a semiconductor device and manufacturing method thereof, specifically to a semiconductor device encapsulated in a package having roughly the same outside dimensions as a semiconductor die packaged in it and a manufacturing method thereof.

2. Description of the Related Art

A CSP (Chip Size Package) has received attention in recent years as a new packaging technology. The CSP means a small package having about the same outside dimensions as those of a semiconductor die packaged in it. A BGA type semiconductor device has been known as a kind of CSP. A plurality of ball-shaped conductive terminals made of metal such as solder is arrayed in a grid pattern on one principal surface of a package of the BGA type semiconductor device and is electrically connected with the semiconductor die mounted on the other side of the package.

When the BGA type semiconductor device is mounted on electronic equipment, the semiconductor die is electrically connected with an external circuit on a printed circuit board by compression bonding of the conductive terminals to wiring patterns on the printed circuit board.

Such a BGA type semiconductor device has advantages in providing a large number of conductive terminals and in reducing size over other CSP type semiconductor devices such as an SOP (Small Outline Package) and a QFP (Quad Flat Package), which have lead pins protruding from their sides. The BGA type semiconductor device is used as an image sensor chip for a digital camera incorporated into a mobile telephone, for example.

FIGS. 13A and 13B show outline structure of a conventional BGA type semiconductor device. FIG. 13A is an oblique perspective figure showing a top side of the BGA type semiconductor device. And FIG. 13B is an oblique perspective figure showing a back side of the BGA type semiconductor device.

A semiconductor die 101 is sealed between a first glass substrate 104a and a second glass substrate 104b through resins 105a and 105b in the BGA type semiconductor device 100. A plurality of ball-shaped conductive terminals (hereafter referred to as conductive terminals) 111 is arrayed in a grid pattern on a principal surface of the second glass substrate 104b, that is, on a back surface of the BGA type semiconductor device 100. The conductive terminals 111 are connected to the semiconductor die 101 through a plurality of second wirings 109. The plurality of second wirings 109 is connected with aluminum first wirings pulled out from inside of the semiconductor die 101, making each of the conductive terminals 111 electrically connected with the semiconductor die 101.

More detailed explanation on a cross-sectional structure of the BGA type semiconductor device 100 is given hereafter referring to FIG. 14. FIG. 14 shows a cross-sectional view of the BGA type semiconductor devices 100 divided along dicing lines into individual dice.

The first wiring 103 is provided on an insulation film 102 on a top surface of the semiconductor die 101. The semiconductor die 101 is bonded to the first glass substrate 104a with the resin 105a. A back surface of the semiconductor die 101 is bonded to the second glass substrate 104b with the resin 105b. One end of the first wiring 103 is connected to the second wiring 109. The second wiring 109 extends from the end of the first wiring 103 to a surface of the second glass substrate 104b. The ball-shaped conductive terminal 111 is formed on the second wiring 109 extending onto the second glass substrate 104b.

The semiconductor device described above has disadvantages of increased thickness and higher manufacturing cost, since it uses two glass substrates. So, a method to bond the glass substrate only to the top surface of the semiconductor die, on which the first wiring is formed, has been considered. In this case, the bottom surface of the device is made of the semiconductor substrate which is easier to process by etching compared with the glass substrate. Taking this advantage, the first wiring is exposed by etching the semiconductor substrate and the insulation film in the dicing line region in order for the first wiring to be connected with the second wiring. As a result, a contact area between the first wiring and the second wiring is increased, compared with the conventional method using two glass substrates. After forming the second wirings, a protection film and the conductive terminals, the semiconductor substrate is finally separated into individual semiconductor dice by cutting the glass substrate.

The insulation film formed on the semiconductor substrate is left exposed in the dicing line region after the first wiring is exposed. At that time, only the insulation film, the resin and the glass substrate exist in the dicing line region. Considering thickness of each component, all of the semiconductor dice are supported practically only with the glass substrate. Furthermore, considerable warping is caused in the glass substrate, because of the difference in thermal expansion coefficients between the semiconductor substrate and the glass substrate. Therefore, weights of the semiconductor dice and others bonded to the glass substrate are imposed on the glass substrate during handling in the manufacturing process. In some cases, this may cause separation 204 between the semiconductor die and the glass substrate (not shown) in peripheral regions of the semiconductor dice and cracks 205 in the glass substrate 202, as shown in FIG. 11. Thus, the yield and reliability of the semiconductor devices have been reduced.

SUMMARY OF THE INVENTION

The invention provides a method of manufacturing a semiconductor device. The method includes providing a semiconductor substrate having a plurality of semiconductor dice, a boundary region between two of the semiconductor dice, an insulation film formed on a surface of the semiconductor substrate to cover at least the boundary region, and a pair of wirings formed on the insulation film so that the a center of the boundary region is located between the pair of wirings. The method also includes bonding a supporting body to the surface of the semiconductor substrate to cover the pair of wirings, and forming an opening in the semiconductor substrate so as to expose the insulation film between the pair of wirings and to expose at least part of the insulation film that is under the pair of wirings.

DETAILED DESCRIPTION OF THE INVENTION

Next, a manufacturing method of a semiconductor device according to an embodiment of this invention will be described referring to cross-sectional views shown in FIG. 1 through FIG. 10 and a plan view shown in FIG. 12 of the semiconductor device.

Figure 1:
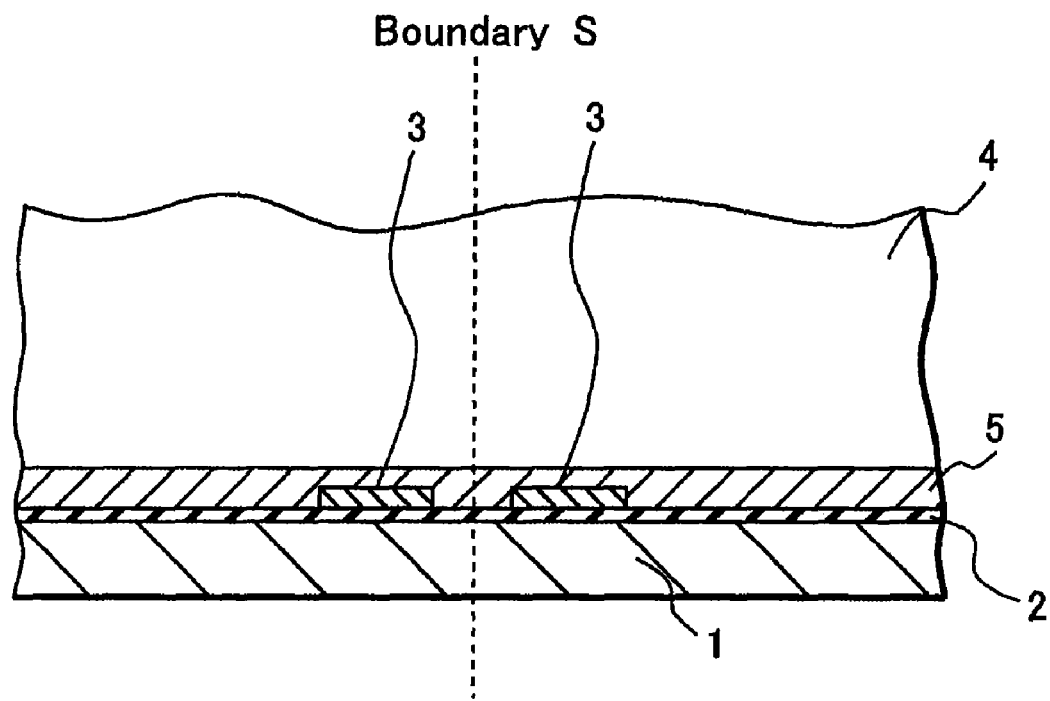
FIG. 1 is a cross-sectional view showing a manufacturing method of a semiconductor device according to an embodiment of this invention.

First, a semiconductor substrate 1 is provided, as shown in FIG. 1. CCD image sensors or semiconductor memories, for example, are formed in the semiconductor substrate 1 through semiconductor wafer processing. A pair of first wirings 3 separated by a predetermined spacing is formed on a surface of the semiconductor substrate 1 through a first insulation film 2 around a border (also referred to as a dicing line or a scribe line) S to divide the semiconductor substrate 1 into individual semiconductor dice. Each of the pair of first wirings 3 makes a pad extending from a bonding pad in the semiconductor device to proximity of the border S. That is, each of the pair of first wirings 3 is a pad for external connection, and is electrically connected with a circuit (not shown) in the semiconductor device.

Next, a glass substrate 4 is provided as a supporting body and is bonded to a surface of the semiconductor substrate 1 on which the first wirings 3 are formed, using a transparent resin 5 (an epoxy resin, for example) as an adhesive. Note that a silicon substrate or a plastic plate may be used as the supporting body other than the glass substrate used in the embodiment. An adhesive suitable for the chosen supporting body is to be selected in this case.

Thickness of the semiconductor substrate 1 is reduced by back-grinding a surface of the semiconductor substrate 1, which is opposite from the surface facing the glass substrate 4. Scratches arise on the back-ground surface of the semiconductor substrate 1, causing bumps and dips of several micrometers in width and in depth. In order to reduce the bumps and dips, the back-ground surface is wet-etched using a chemical solution having a high selection ratio between an etching rate for silicon which is a material of the semiconductor substrate 1 and an etching rate for silicon oxide which is a material of the first insulation film 2.

There is no specific restriction on the chemical solution as long as it has a high selection ratio. For example, a mixed solution composed of 2.5% of hydrofluoric acid, 50% of nitric acid, 10% of acetic acid and 37.5% of water is used as the etching solution in this embodiment.

Although doing the wet-etching is preferable, this invention does not necessarily include the wet-etching.

Figure 2A:
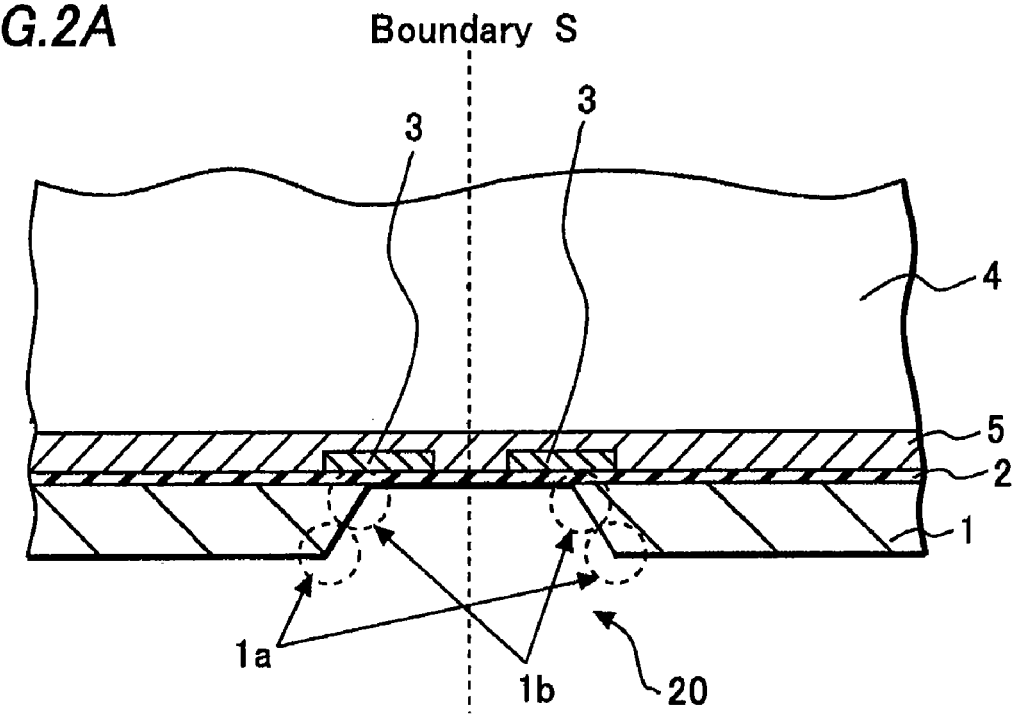
FIGS. 2A and 2B are cross-sectional views showing the manufacturing method of the semiconductor device according to the embodiment of this invention.
Figure 2B:
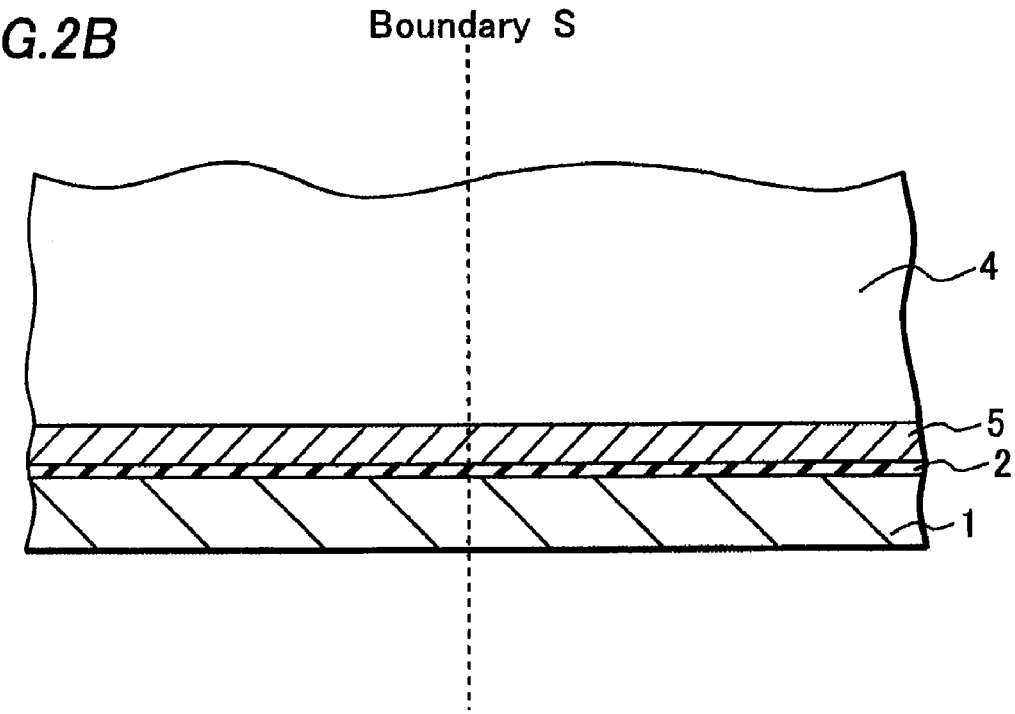

Next, the semiconductor substrate 1 is etched isotropically (or anisotropically) to expose portions of the first wirings 3, using a mask of photoresist (not shown) formed on the surface of the semiconductor substrate 1 opposite from the surface facing the glass substrate 4, as shown in FIGS. 2A and 2B. As a result, a window 20 opened along a border S in a region around the first wirings 3 is formed to expose the first insulation film 2, as shown in FIG. 2A. On the other hand, the semiconductor substrate 1 remains intact in a region where the first wiring does not exist, as shown in FIG. 2B.

The area of the semiconductor substrate 1 bonded to the glass substrate 4 through the first insulation film 2 and the resin 5 is still maintained large by forming the windows 20 which are opened only in the regions around the first wirings 3, as described above. Strength to support the glass substrate 4 is stronger than the conventional method. Also, warping of the glass substrate 4 due to the difference in thermal expansion coefficients between the semiconductor substrate 1 and the glass substrate 4 is reduced as well as cracks and separation in the semiconductor device.

Figure 12:
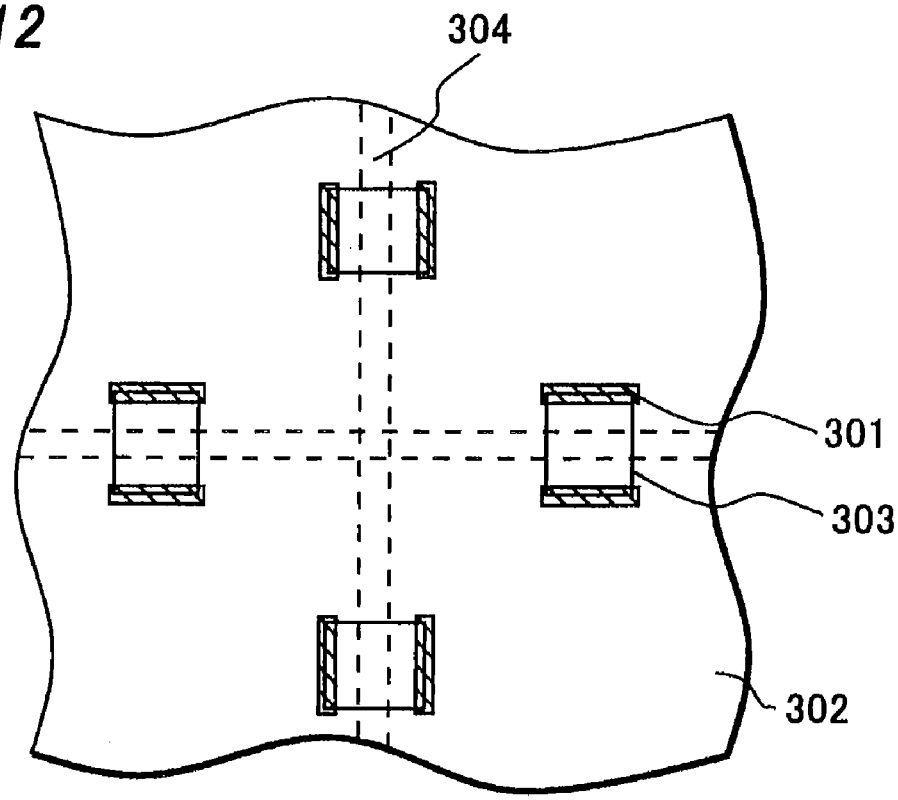
FIG. 12 is a plan view showing the semiconductor device intermediate according to the embodiment of this invention.
Figure 13A:
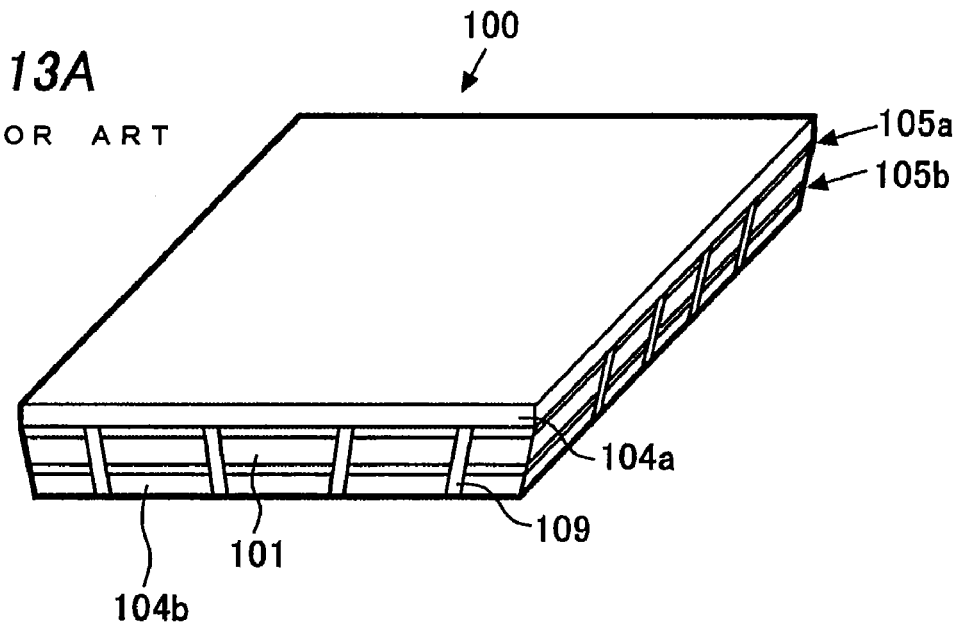
FIGS. 13A and 13B are oblique perspective views showing the BGA type semiconductor device according to the conventional art.
Figure 13B:
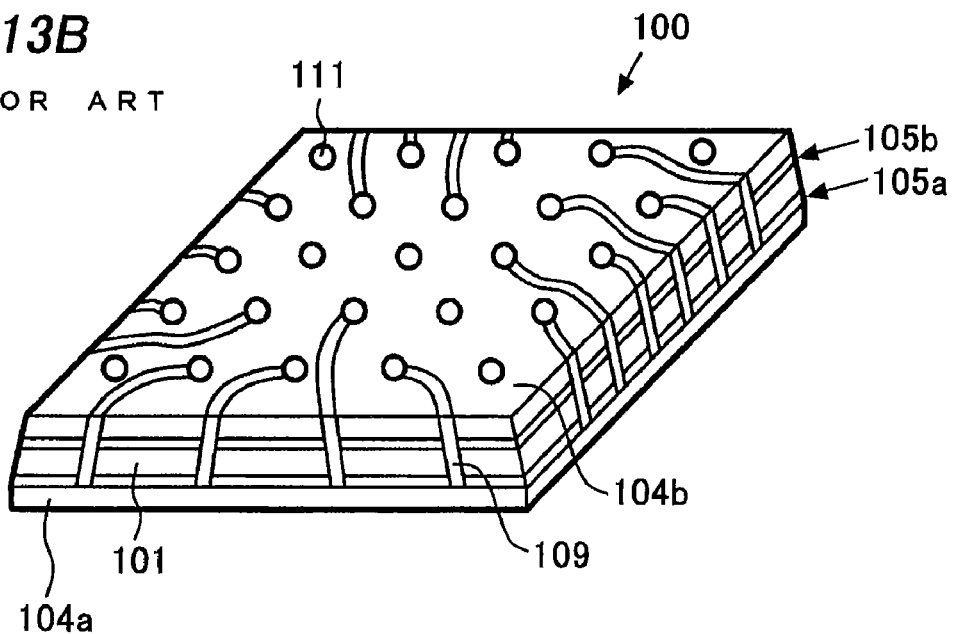
Figure 14:
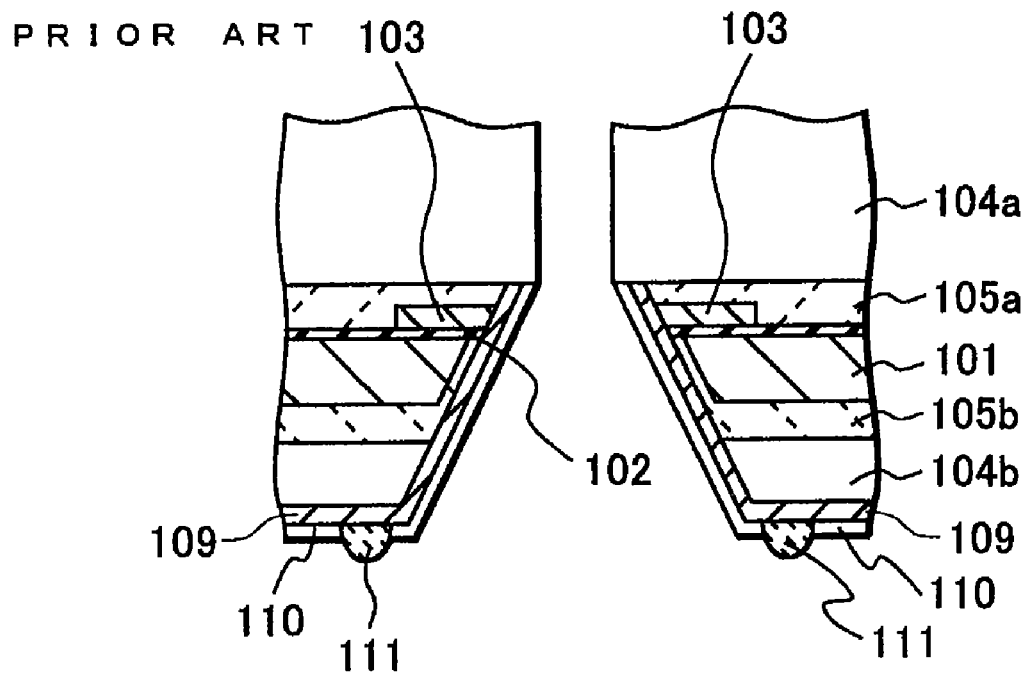
FIG. 14 is a cross-sectional view showing the BGA type semiconductor device according to the conventional art.

FIG. 12 shows a plan view of the device intermediate at the process step of FIGS. 2A and 2B. Only a portion of a semiconductor substrate in the region under and between the pair of first wirings 301 is removed by etching instead of the whole scribe line region 304. The portion removed by the etching is called a window 303, which corresponds to the window 20 shown in FIG. 2A. As a result, most area of a supporting body is in contact with the semiconductor substrate 302 through the resin and the insulation film.

Note that the etching may be performed either by dry-etching or by wet-etching. In explanations on the manufacturing process hereafter, symbol A denotes a figure showing the region where the window 20 is formed, while symbol B denotes a figure showing the region where the window 20 is not formed, as in the case of FIG. 2A and FIG. 2B.

There are bumps and dips, residues and foreign particles on the surface of the semiconductor substrate 1. In addition, there are sharp edges at corners of the window 20, as shown in circles denoted 1a and 1b in FIG. 2A.

Figure 3A:
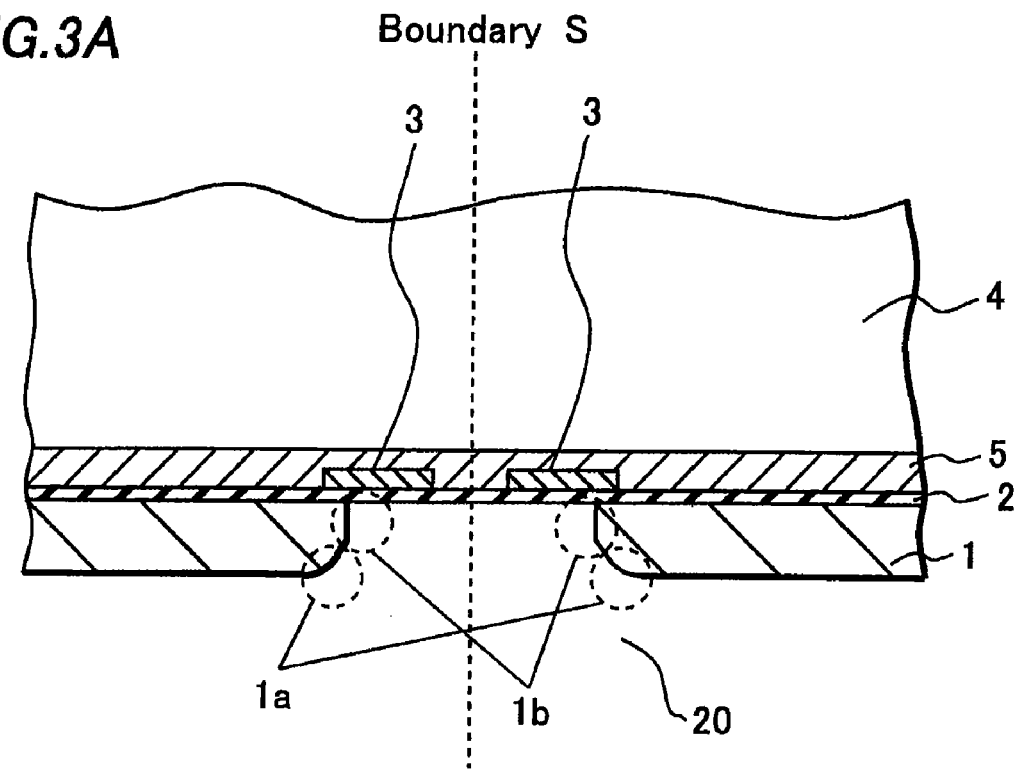
FIGS. 3A and 3B are cross-sectional views showing the manufacturing method of the semiconductor device according to the embodiment of this invention.
Figure 3B:
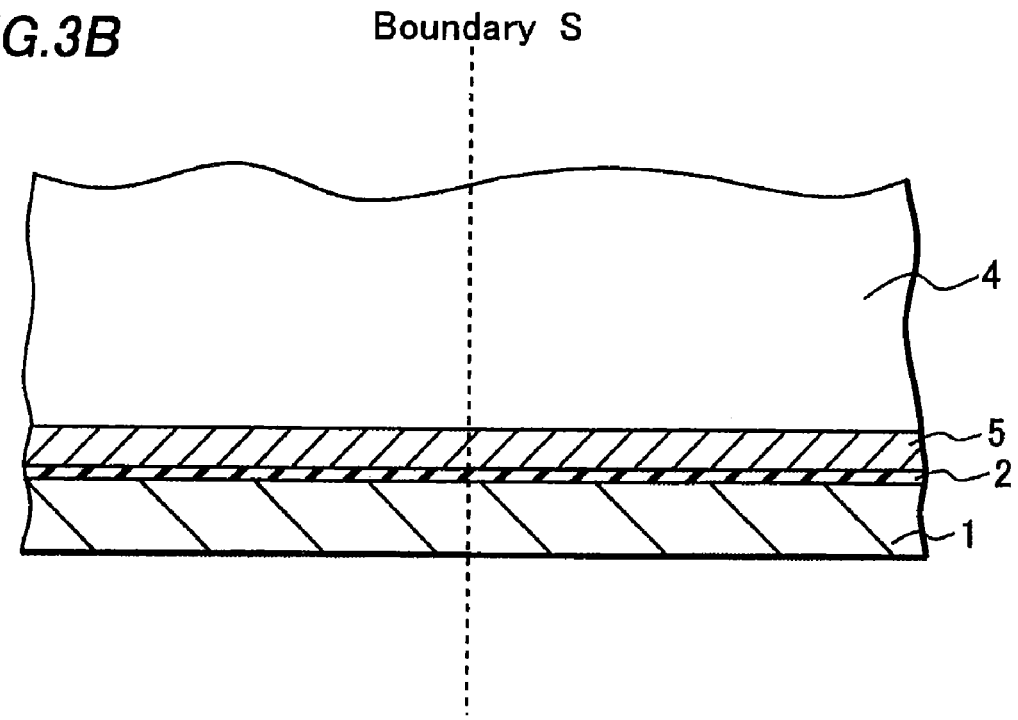

Wet-etching is made to remove the residues and the foreign particles and round the sharp edges, as shown in FIGS. 3A and 3B. With this, the sharp edges shown in the circles 1a and 1b in FIG. 2A are smoothed out, as shown in circles 1a and 1b in FIG. 3A.

Figure 4A:
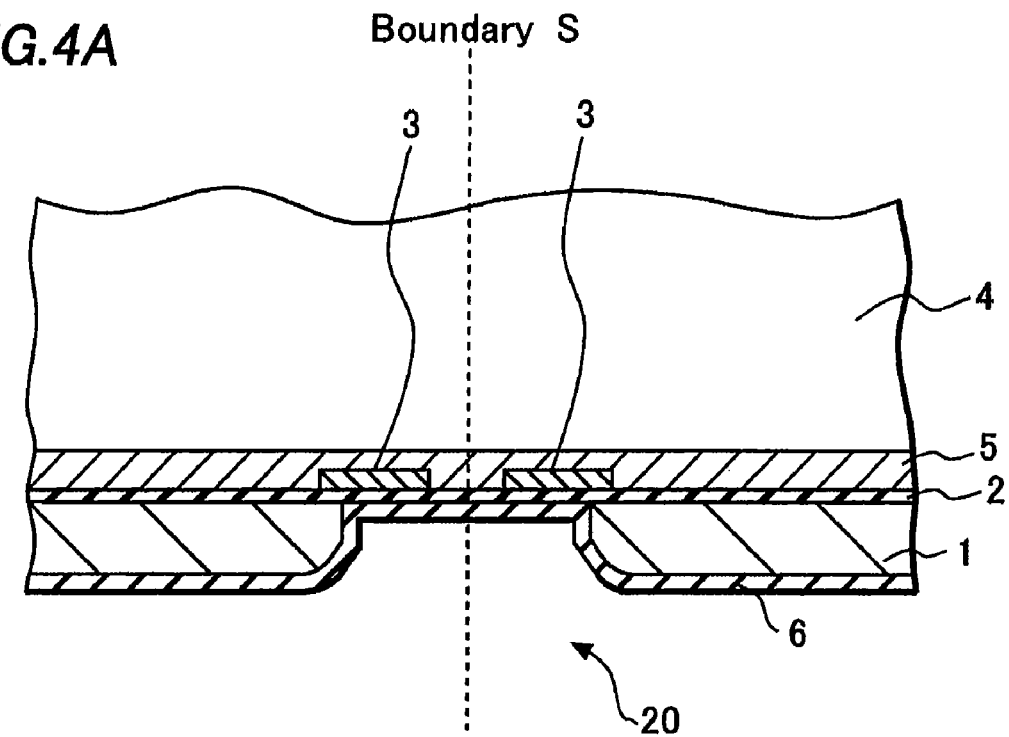
FIGS. 4A and 4B are cross-sectional views showing the manufacturing method of the semiconductor device according to the embodiment of this invention.
Figure 4B:
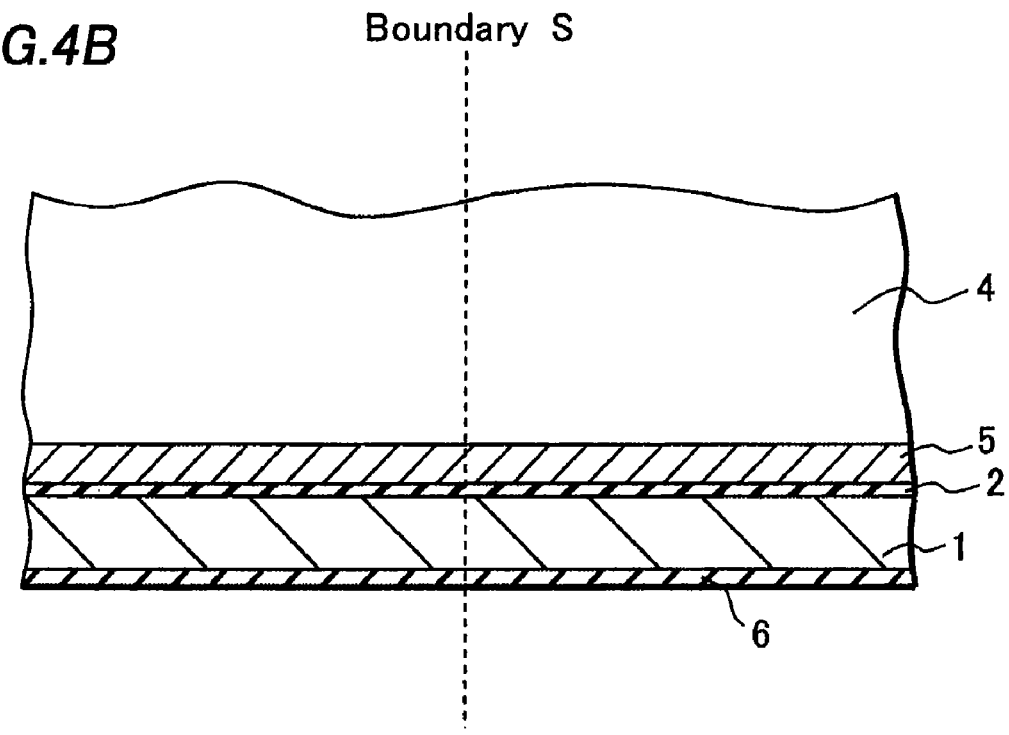

Next, a second insulation film 6 is formed on the surface of the semiconductor substrate 1 opposite from the surface facing the glass substrate 4, as shown in FIGS. 4A and 4B. A silane-based oxide film of 3 μm in thickness is formed in this embodiment.

Figure 5A:
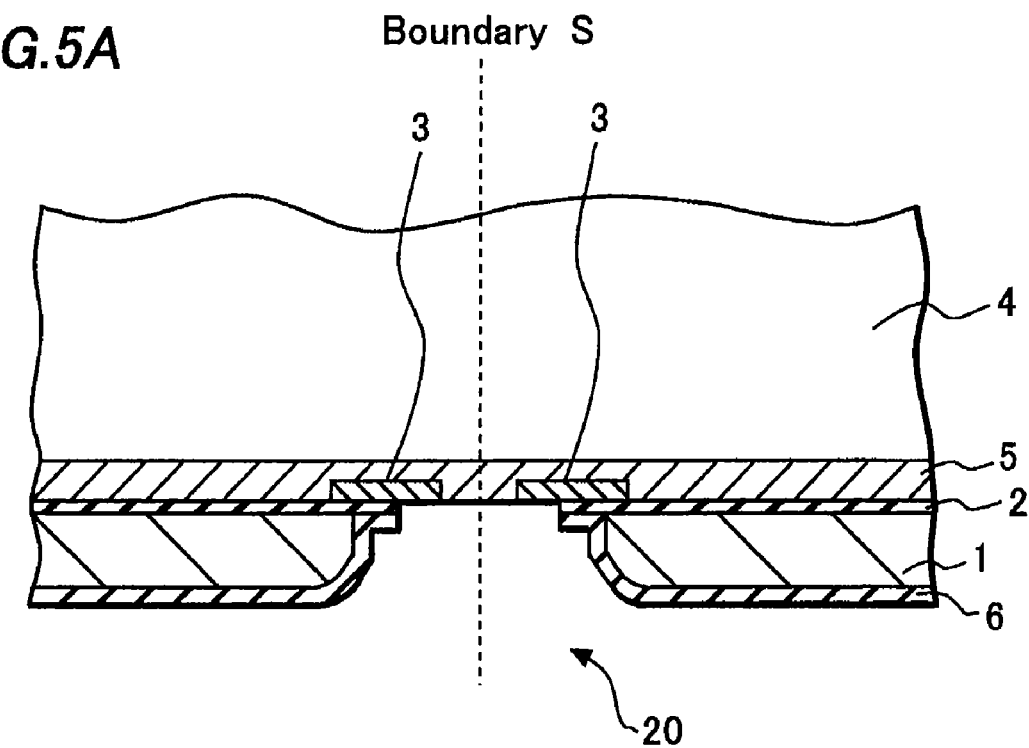
FIGS. 5A and 5B are cross-sectional views showing the manufacturing method of the semiconductor device according to the embodiment of this invention.
Figure 5B:
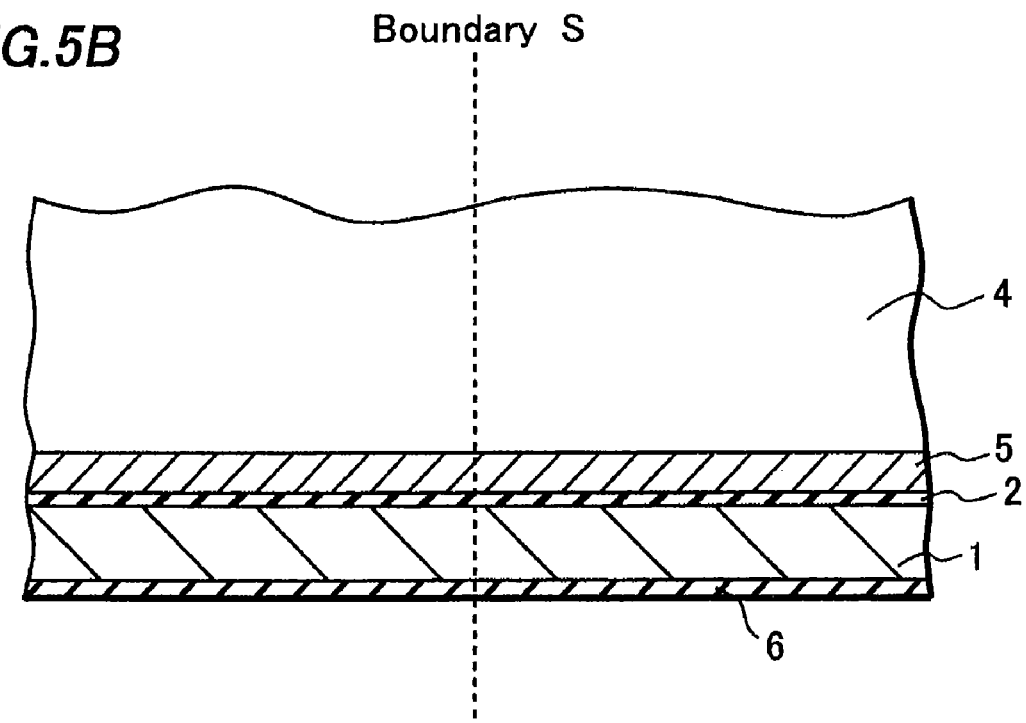

Next, a photoresist film (not shown) is applied above the surface of the semiconductor substrate 1 opposite from the surface facing the glass substrate 4 and pattering is made to form an opening in the photoresist film in the window 20 along the border S. Then portions of the first wirings 3 are exposed by etching the second insulation film 6 and the first insulation film 2 using the photoresist film (not shown) as a mask, as shown in FIGS. 5A and 5B.

Figure 6A:
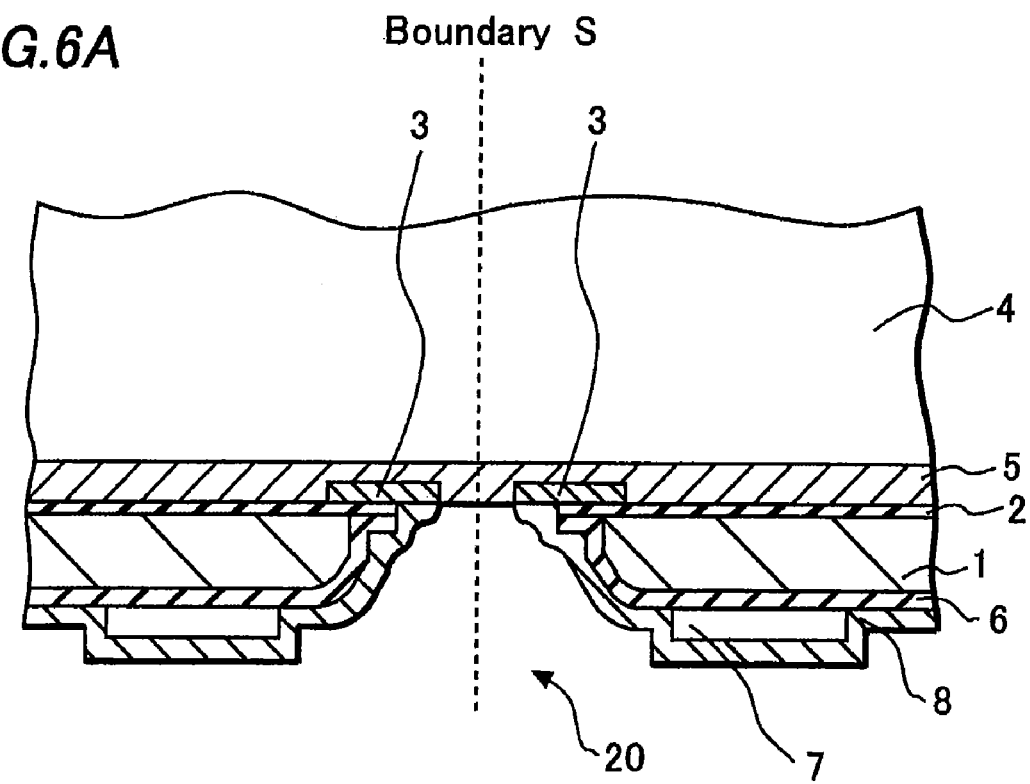
FIGS. 6A and 6B are cross-sectional views showing the manufacturing method of the semiconductor device according to the embodiment of this invention.
Figure 6B:
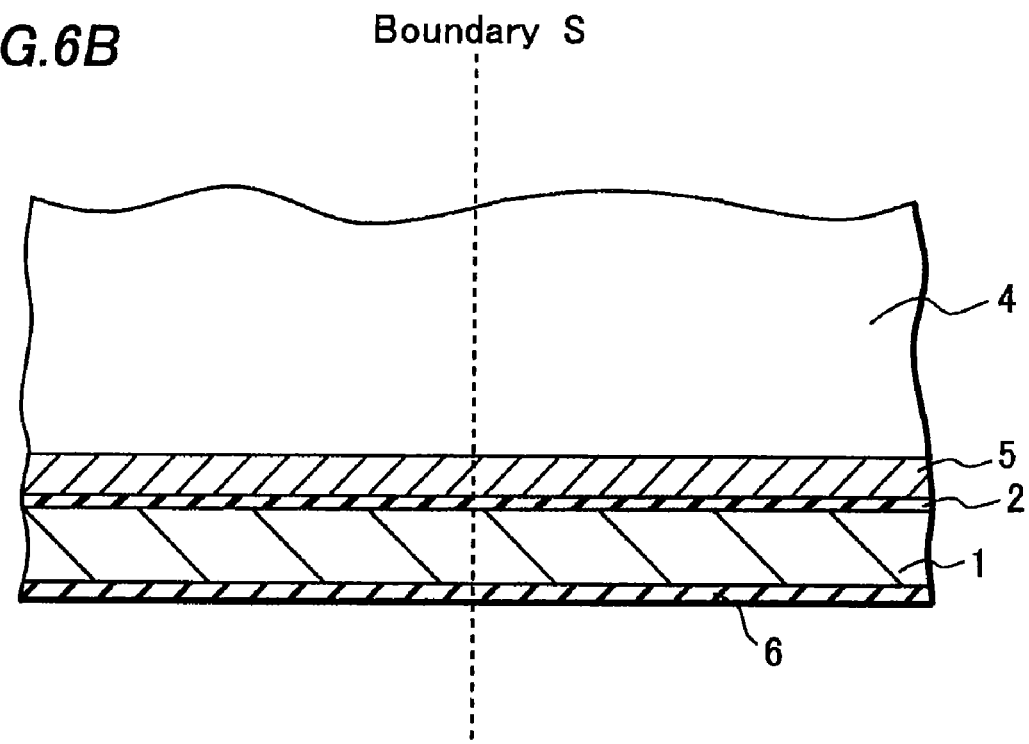

Next, flexible cushioning pads 7 are formed at locations where conductive terminals 11 are formed later, as shown in FIGS. 6A and 6B. The cushioning pads 7 have function to absorb power applied through the conductive terminals 11 and relax stress when the conductive terminals 11 are bonded. However, this invention does not necessarily require including the cushioning pads 7.

A second wiring layer 8 is formed above the surface of the semiconductor substrate 1 opposite from the surface facing the glass substrate 4. With this, each of the first wirings 3 is electrically connected with the second wiring layer 8.

After that, a photoresist film (not shown) is applied above the surface of the semiconductor substrate 1 opposite from the surface facing the glass substrate 4. An opening is formed in the photoresist film in the window 20 along the border S in the region where the window 20 has been formed. On the other hand, the photoresist film is removed to expose the second wiring layer 8 in the region where the window 20 is not formed. Etching is performed using the photoresist film (not shown) as a mask to remove a portion of the second wiring layer 8 around the border S. Also, the second wiring layer 8 in the region where the window 20 is not formed is removed to complete the second wirings 8.

Figure 7A:
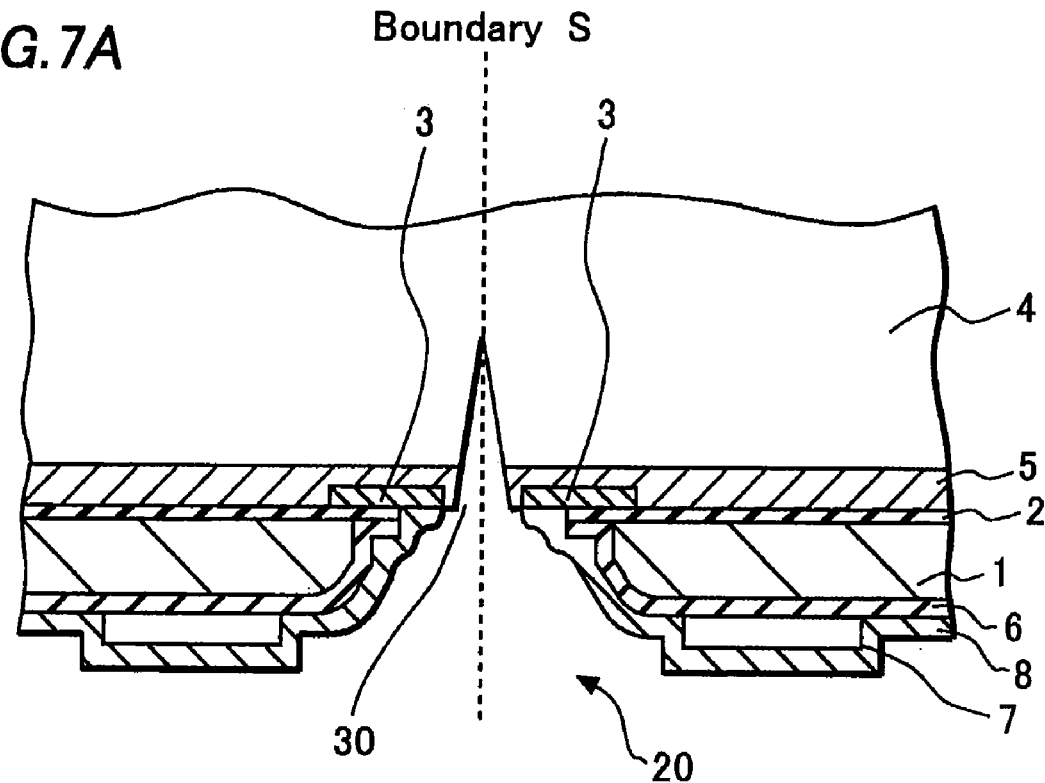
FIGS. 7A and 7B are cross-sectional views showing the manufacturing method of the semiconductor device according to the embodiment of this invention.
Figure 7B:
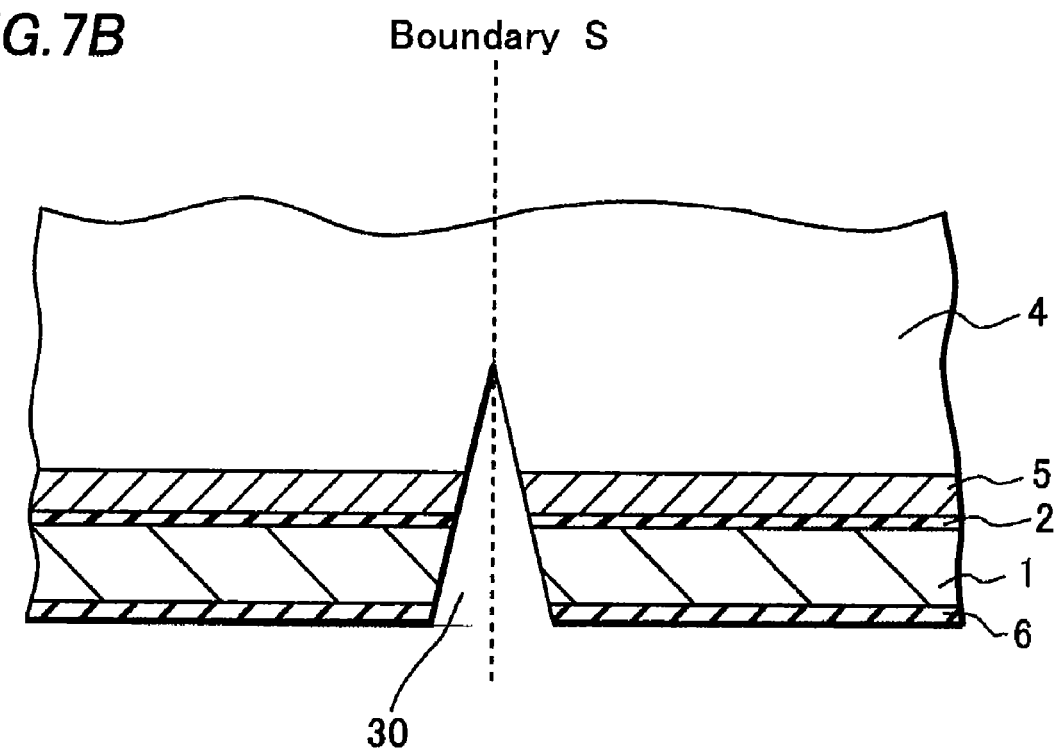

Next, a slit 30 (an inverted V-shaped groove) is formed in the glass substrate 4 along the border S so that the glass substrate 4 is cut to a depth of 30 μm, for example, as shown in FIGS. 7A and 7B.

That is, the resin 5 and a portion of the glass substrate 4 are cut to form the slit 30 in the region where the first wirings 3 exist (the region in the window 20 along the border S). It is necessary to use a blade of a width narrow enough not to contact the second wirings 8 in the window 20 in this process.

On the other hand, the semiconductor substrate 1, the first insulation film 2, the resin 5 and a portion of the glass substrate 4 are cut to form the slit 30 in the region where the first wiring 3 does not exist (i.e., the region where the window 20 is not formed).

Although the slit 30 has a wedge-shaped cross-section in the embodiment, it may have a rectangular cross-section. Besides, this invention does not necessary require the process step to form the slit 30.

Figure 8A:
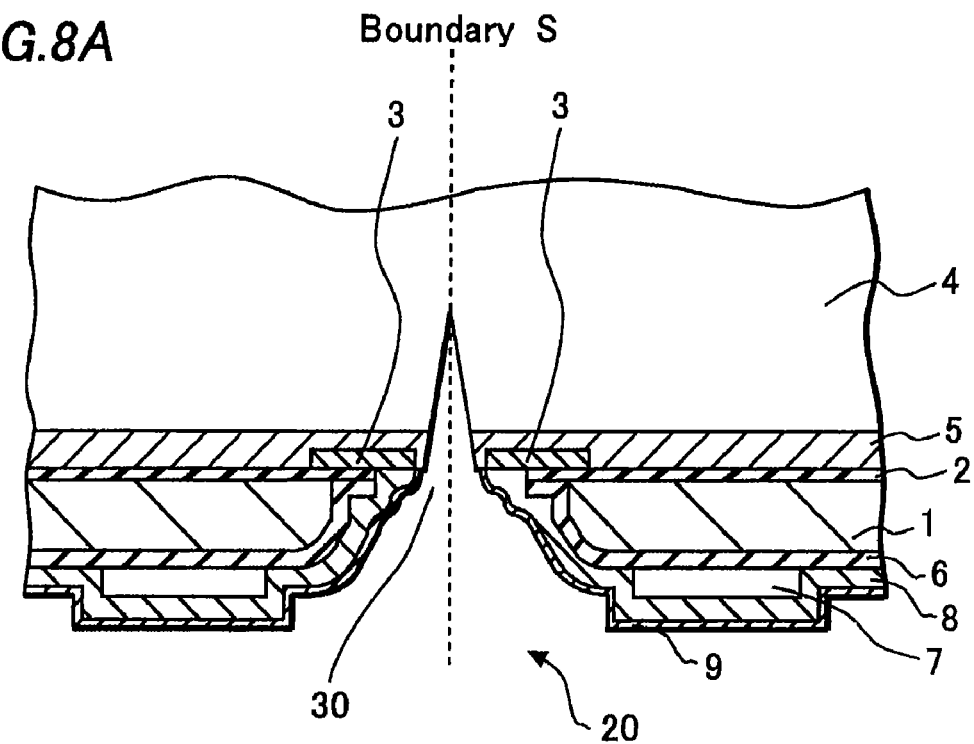
FIGS. 8A and 8B are cross-sectional views showing the manufacturing method of the semiconductor device according to the embodiment of this invention.
Figure 8B:
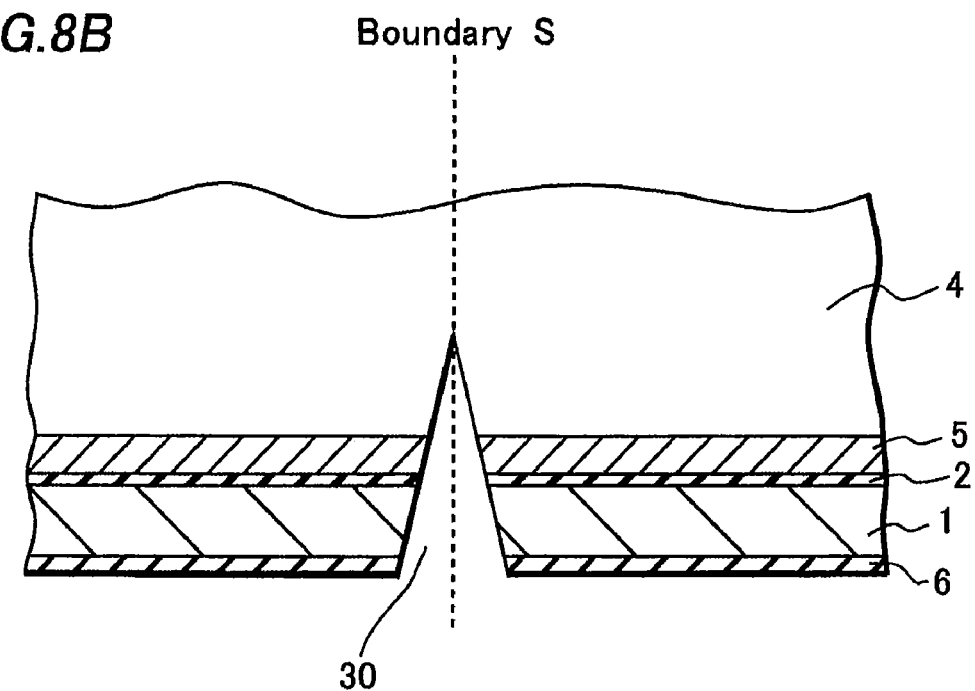

Next, electroless plating is applied to the surface above the semiconductor substrate 1 opposite from the surface facing the glass substrate 4 to form a Ni—Au plating film 9 on the second wirings 8, as shown in FIGS. 8A and 8B. The film is formed only on the second wirings 8 because it is formed by plating.

Figure 9A:
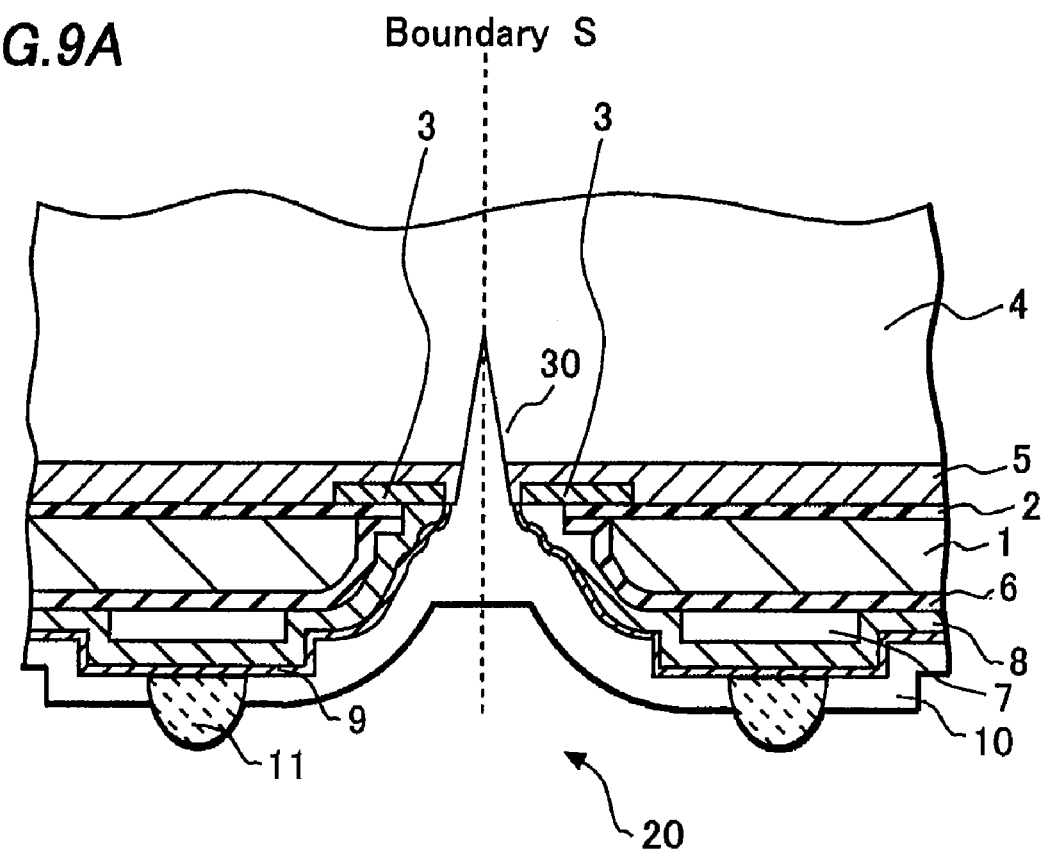
FIGS. 9A and 9B are cross-sectional views showing the manufacturing method of the semiconductor device according to the embodiment of this invention.
Figure 9B:
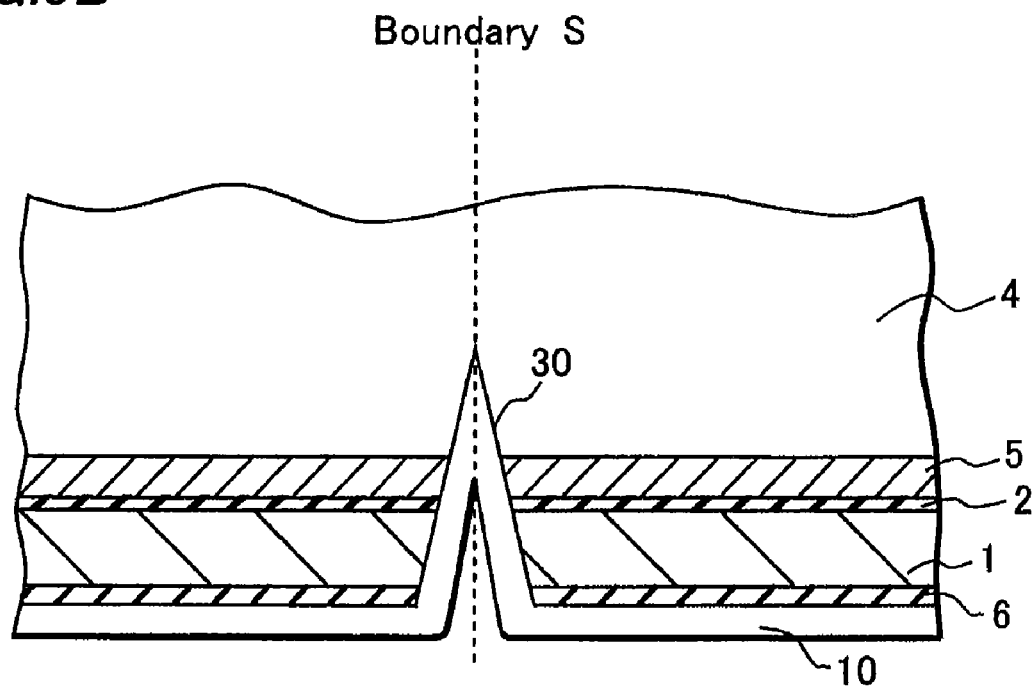

Next, a protection film 10 is formed on a surface above the semiconductor substrate 1 opposite from the surface facing the glass substrate 4, as shown in FIGS. 9A and 9B. In order to form the protection film 10, the surface opposite from the surface facing the glass substrate 4 is held upward, a thermo-setting organic resin is dropped on it and the organic resin is spread over the surface by spinning the semiconductor substrate 1 utilizing centrifugal force. With this, the protection film 10 is formed above the back surface of the semiconductor substrate 1 including a inner wall of the slit 30 formed along the border S.

In other words, the protection film 10 is formed to cover the second insulation film 6 and the resin 5 and the glass substrate 4 exposed on the inner wall of the slit 30 in the region where the first wirings 3 exist (the region in the window 20 along the border S). On the other hand, the protection film 10 is formed to cover the second insulation film 6, the semiconductor substrate 1, the first insulation film 2, the resin 5 and the glass substrate 4 exposed on the inner wall of the slit 30 in the region other than the region where the first wirings 3 exist (i.e. the region where the window 20 is not formed).

After that, portions of the protection film 10 above locations where the conductive terminals 11 are to be formed are removed by etching using a photoresist film (with openings at locations corresponding to the cushioning pads 7, not shown) as a mask and the conductive terminals 11 are formed on the Ni—Au plating film 9 at the locations corresponding to the cushioning pads 7. The conductive terminals 11 are electrically connected with the second wirings 8 through the Ni—Au plating film 9. The conductive terminals 111 are formed of solder bumps of gold bumps. When the gold bumps are used, thickness of the conductive terminal 11 can be reduced from 160 μm to several micrometers or several tens of micrometers.

Figure 10A:
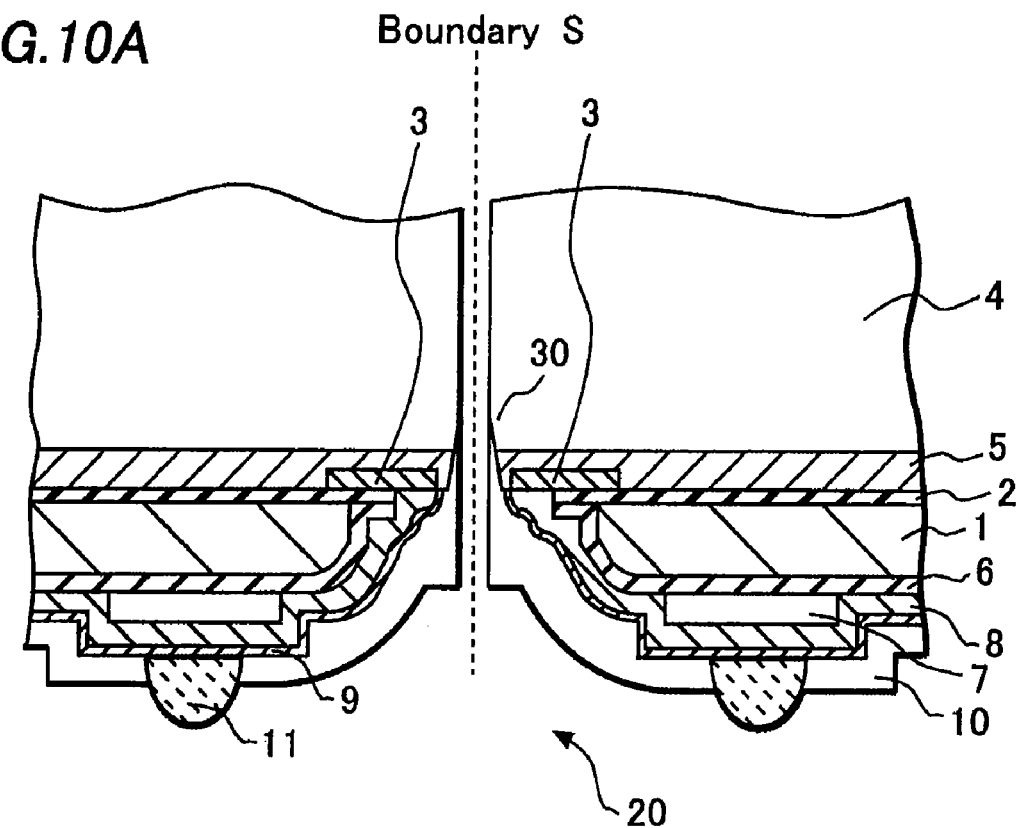
FIGS. 10A and 10B are cross-sectional views showing the manufacturing method of the semiconductor device according to the embodiment of this invention.
Figure 10B:
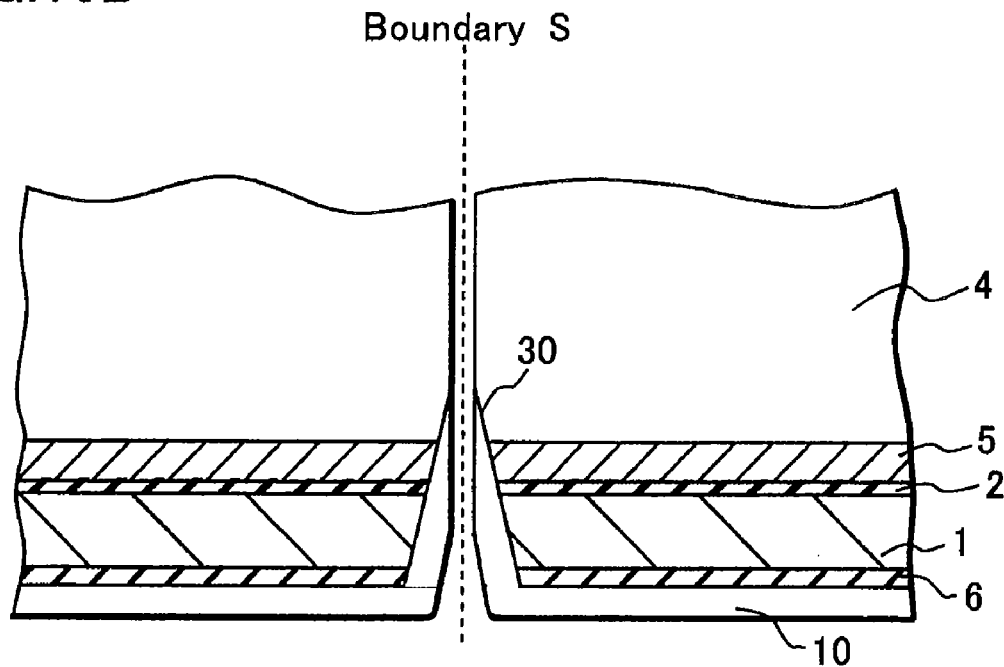
Figure 11:
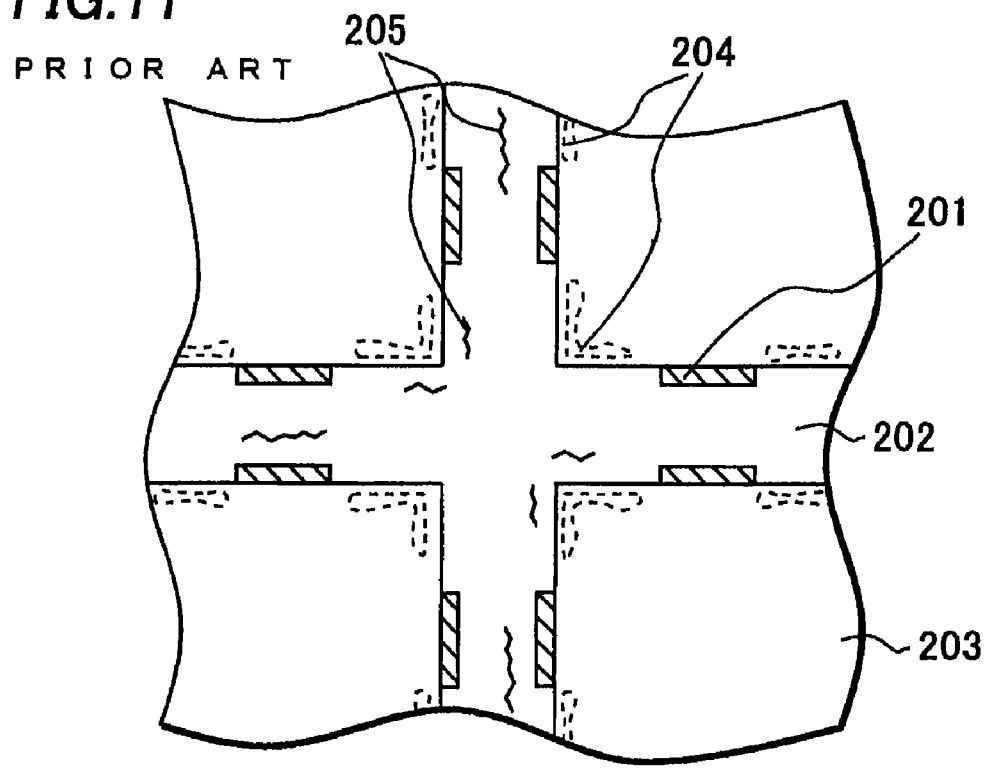
FIG. 11 is a plan view showing a BGA type semiconductor device intermediate according to conventional art.

Then the semiconductor substrate is diced into individual semiconductor dice along the border S at a portion where the slit 30 is provided, as shown in FIGS. 10A and 10B. A dicing blade preferably has a width to cut only the glass substrate 4 and the protection film 10 in the slit 30.

In the manufacturing method of the semiconductor device according to the embodiment, the dicing is performed in two steps, that is, the slit 30 is formed and then dicing is made after forming the protection film 10 to cover the slit 30. By doing so, separation can be made by dicing only the glass substrate 4 and the protection film 10, since the inner wall of the slit 30 formed along the border S (i.e. the dicing line) is covered with the protection film 10 when the dicing to separate the semiconductor device into the individual dice is performed. It means that the blade does not contact layers (the resin 5, the second wirings 8, etc.) and contacts only the glass substrate 4 and the protection film 10. Therefore, the separation caused in the separated semiconductor device, that is, on a cut surface or at an edge of the semiconductor dice by contacting the blade in the dicing process, can be prevented as much as possible.

As a result, yield and reliability of the semiconductor device can be improved. Also, the semiconductor device of this invention can be made thinner and produced at reduced cost, since it is formed of the single glass substrate.

Although the conductive terminals 11 electrically connected with the second wirings 8 are formed in this embodiment, this invention does not necessarily require the terminals. That is, this invention may be applied to a semiconductor device without the conductive terminals (an LGA (Land Grid Array) type package, for example).

Yield and reliability can be improved by preventing the cracks caused in the glass substrate and the separation in the peripheral regions of the semiconductor dice with this invention. In addition, the semiconductor device can be made thinner and produced at reduced cost, since a number of the glass substrates used in the device is reduced from two to one.

What is claimed is:

1. A semiconductor device comprising:
    a semiconductor die having an insulation film formed on a front surface thereof;
    a first wiring formed on the insulation film;
    a supporting body disposed on the insulation film and the first wiring;
    an adhesive layer attaching the supporting body to the front surface of the semiconductor die so as to cover all lateral edges of the first wiring;
    a recess portion formed in the semiconductor die and extending from a side of the semiconductor die horizontally with respect to the front surface and extending from a back surface of the semiconductor die vertically with respect to the front surface so as to extend into the supporting body; and
    a second wiring disposed in the recess portion so as to be connected to the first wiring; and
    a protection film disposed on the second wiring so as to be in contact with a side surface of the supporting body,
    wherein, in plan view of the semiconductor device, a length of the recess portion along said side of the semiconductor die is shorter than a length of the semiconductor die along said side of the semiconductor die, and
    in plan view of the semiconductor device a part of the first wiring is in the recess portion and not covered by the semiconductor die, and another part of the first wiring is covered by the semiconductor die.

2. The semiconductor device of claim 1, wherein part of the first wiring is disposed between the semiconductor die and the supporting body.

3. The semiconductor device of claim 2, wherein the length of the recess portion along said side of the semiconductor die is shorter than a length of the first wiring along said side of the semiconductor die so that both ends of the first wiring along said side of the semiconductor die are covered by the semiconductor die.

4. The semiconductor device of claim 2, wherein the recess portion extends horizontally so as not to reach a side of the first wiring that is normal to said side of the semiconductor die.

* * * * *